(12) United States Patent
Lee et al.

(10) Patent No.: US 11,576,287 B2
(45) Date of Patent: Feb. 7, 2023

(54) SOLID STATE DRIVE APPARATUS INCLUDING ELECTROSTATIC PREVENTION STRUCTURE

(71) Applicant: Samsung Electronics Co., Ltd., Suwon-si (KR)

(72) Inventors: Sung-ki Lee, Seoul (KR); In-sub Kwak, Seoul (KR); Il-han Yun, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 850 days.

(21) Appl. No.: 16/299,298

(22) Filed: Mar. 12, 2019

(65) Prior Publication Data

US 2020/0077547 A1 Mar. 5, 2020

(30) Foreign Application Priority Data

Aug. 30, 2018 (KR) .................. 10-2018-0103028

(51) Int. Cl.
*H05K 9/00* (2006.01)
*G06F 3/06* (2006.01)
(Continued)

(52) U.S. Cl.
CPC ......... *H05K 9/0067* (2013.01); *G06F 3/0679* (2013.01); *G11C 5/04* (2013.01); *H01L 23/60* (2013.01); *H05K 9/0007* (2013.01)

(58) Field of Classification Search
CPC ... H05K 9/0007; H05K 9/0067; G06F 3/0679
See application file for complete search history.

(56) References Cited

U.S. PATENT DOCUMENTS

| 4,767,003 A | * | 8/1988 | Rice | ..................... H05K 9/0067 206/508 |
| 5,206,783 A | * | 4/1993 | Mori | ..................... H05K 9/0067 361/220 |

(Continued)

FOREIGN PATENT DOCUMENTS

| CN | 101425324 A | * | 5/2009 | ........... H05K 9/0067 |
| CN | 106972007 A | | 7/2017 | |

(Continued)

OTHER PUBLICATIONS

Chinese Office Action dated Mar. 3, 2022 for CN Patent Application No. 201910337572.1.

(Continued)

*Primary Examiner* — Rockshana D Chowdhury
*Assistant Examiner* — Douglas R Burtner
(74) *Attorney, Agent, or Firm* — Harness, Dickey & Pierce, P.L.C.

(57) ABSTRACT

A solid state drive apparatus includes a case including a base and side walls extending upward along a circumference of the base, an electrostatic prevention structure of a metal pillar spaced apart from the side walls and protruding from at least a partial surface of the base and an electrostatic absorbing member on at least a partial surface of the metal pillar, a package substrate module mounted on the electrostatic prevention structure in the case, and a cover covering the case and the package substrate module.

9 Claims, 9 Drawing Sheets

(51) Int. Cl.
*H01L 23/60* (2006.01)
*G11C 5/04* (2006.01)

(56) References Cited

U.S. PATENT DOCUMENTS

| | | | | |
|---|---|---|---|---|
| 5,782,370 | A * | 7/1998 | Kamiya | H05K 9/0067 |
| | | | | 220/784 |
| 5,846,092 | A * | 12/1998 | Feldman | H05K 5/0282 |
| | | | | 439/946 |
| 7,173,826 | B1 * | 2/2007 | Chiou | H05K 5/0269 |
| | | | | 361/801 |
| 7,252,518 | B1 * | 8/2007 | Ni | H01R 13/6658 |
| | | | | 439/76.1 |
| 7,517,231 | B2 * | 4/2009 | Hiew | H05K 9/0067 |
| | | | | 439/76.1 |
| 7,742,316 | B2 | 6/2010 | Ho et al. | |
| 8,102,662 | B2 * | 1/2012 | Hiew | G06F 1/1632 |
| | | | | 361/752 |
| 8,271,723 | B1 | 9/2012 | Nasiby et al. | |
| 8,402,206 | B2 | 3/2013 | Nasiby et al. | |
| 8,665,601 | B1 * | 3/2014 | Mangay-Ayam, Jr. | |
| | | | | H05K 9/0066 |
| | | | | 361/728 |
| 8,994,133 | B2 | 3/2015 | Chen | |
| 9,036,295 | B1 | 5/2015 | Casey et al. | |
| 9,379,073 | B2 | 6/2016 | Chen | |
| 2005/0195581 | A1 * | 9/2005 | Chiou | H05K 5/0269 |
| | | | | 361/752 |
| 2005/0253239 | A1 * | 11/2005 | Nishizawa | G06K 19/07732 |
| | | | | 257/679 |
| 2007/0180264 | A1 * | 8/2007 | Ni | H05K 5/0269 |
| | | | | 361/752 |
| 2008/0055861 | A1 | 3/2008 | Nagareda et al. | |
| 2008/0089020 | A1 * | 4/2008 | Hiew | H05K 9/0067 |
| | | | | 361/825 |
| 2009/0190277 | A1 * | 7/2009 | Hiew | G06F 1/1632 |
| | | | | 361/56 |
| 2010/0062617 | A1 * | 3/2010 | Bang | G06F 1/18 |
| | | | | 29/829 |
| 2010/0176013 | A1 * | 7/2010 | Nagai | C09J 171/02 |
| | | | | 206/320 |
| 2010/0328835 | A1 | 12/2010 | Shin | |
| 2011/0089465 | A1 * | 4/2011 | Lin | H01L 23/60 |
| | | | | 257/659 |
| 2012/0224336 | A1 * | 9/2012 | Lin | H05K 5/0278 |
| | | | | 361/752 |
| 2012/0274868 | A1 | 11/2012 | Cho et al. | |
| 2012/0320537 | A1 * | 12/2012 | Kaufman | H02H 9/045 |
| | | | | 361/729 |
| 2015/0084816 | A1 | 3/2015 | Kurose et al. | |
| 2015/0109747 | A1 * | 4/2015 | Saito | B60R 16/02 |
| | | | | 361/753 |
| 2015/0131242 | A1 * | 5/2015 | Kim | H01L 23/36 |
| | | | | 361/753 |
| 2015/0359146 | A1 * | 12/2015 | Bailey | H05K 9/0067 |
| | | | | 53/473 |
| 2017/0135188 | A1 * | 5/2017 | Heidebrecht | G06F 1/182 |
| 2017/0164501 | A1 * | 6/2017 | Killen | H05K 7/1489 |
| 2018/0063945 | A1 * | 3/2018 | Kuhn | H01R 13/6485 |
| 2019/0132978 | A1 * | 5/2019 | Lim | H05K 5/04 |

FOREIGN PATENT DOCUMENTS

| | | |
|---|---|---|
| CN | 207425909 U | 5/2018 |
| JP | 2011-002949 A | 1/2011 |
| JP | 2016-042582 A | 3/2016 |
| JP | 2016-149575 A | 8/2016 |
| KR | 20170052983 A * | 5/2017 |

OTHER PUBLICATIONS

Office Action dated Sep. 29, 2022 in Korean Application No. 10-2018-0103028.

* cited by examiner

SOLID STATE DRIVE APPARATUS INCLUDING ELECTROSTATIC PREVENTION STRUCTURE

CROSS-REFERENCE TO RELATED APPLICATION

This application claims the benefit of Korean Patent Application No. 10-2018-0103028, filed on Aug. 30, 2018, in the Korean Intellectual Property Office, the disclosure of which is incorporated herein in its entirety by reference.

BACKGROUND

Example embodiments of the inventive concepts relate to a solid state drive apparatus. For example, at least some example embodiments relate to a solid state drive apparatus including an electrostatic prevention structure.

When a solid state drive apparatus is used as a storage apparatus, large-capacity data may be input and output at a high speed and thus there is an increased demand for the solid state drive apparatus. As a data processing speed of the solid state drive apparatus increases, due to external electrostatic discharge, noise of a certain frequency band may be received inside the solid state drive apparatus. When the noise is received, soft errors or soft fails, for example, bit errors of one bit to several bits may be generated when the solid state drive apparatus processes data.

SUMMARY

Example embodiments of the inventive concepts provide a solid state drive apparatus including an electrostatic prevention structure capable of reducing (or, alternatively, preventing) soft errors from being generated by external electrostatic discharge.

According to an example embodiment of the inventive concepts, there is provided a solid state drive apparatus including a case including a base and side walls, the side walls extending perpendicular to the base along a circumference of the base; an electrostatic prevention structure protruding from at least a partial surface of the base, the electrostatic prevention structure including a metal pillar and an electrostatic absorbing member, the metal pillar being spaced apart from the side walls of the case, and the electrostatic absorbing member being on at least a partial surface of the metal pillar; a package substrate module on the electrostatic prevention structure in the case; and a cover covering the case and the package substrate module.

According to an example embodiment of the inventive concepts, there is provided a solid state drive apparatus including a case including a base and side walls, the side walls extending perpendicular to the base along a circumference of the base; an electrostatic prevention structure separated from the side walls by a distance, the electrostatic prevention structure including a metal pillar and an electrostatic absorbing member, the metal pillar including a plurality of sub-pillars having holes therein, and the electrostatic absorbing member being on the metal pillar and the holes; a package substrate module on a plurality of substrate mounting units in the side walls in the case and on the electrostatic prevention structure; and a cover covering the case and the package substrate module.

According to an example embodiment of the inventive concepts, there is provided a solid state drive apparatus including a case including a base and side walls, the side walls extending perpendicular to the base along a circumference of the base; an electrostatic prevention structure separated from the side walls by a distance, the electrostatic prevention structure including a metal pillar and an electrostatic absorbing member, the metal pillar including a plurality of sub-pillars and a sub-connection pillar, the sub-connection pillar connecting a portion of side walls of the sub-pillars, holes in at least one of the sub-pillars and the sub-connection pillar, and the electrostatic absorbing member being on the metal pillar and the holes; a package substrate module on a plurality of substrate mounting units in the side walls in the case and on the electrostatic prevention structure; and a cover covering the case and the package substrate module.

The solid state drive apparatus according to example embodiments of the inventive concepts includes the electrostatic prevention structure including the metal pillar in the case close to the semiconductor chip mounted on the package substrate module and the electrostatic absorbing member on the metal pillar. Therefore, the solid state drive apparatus according to example embodiments of the inventive concepts may reduce (or, alternatively, prevent) soft errors, for example, bit errors from being generated by external electrostatic discharge.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
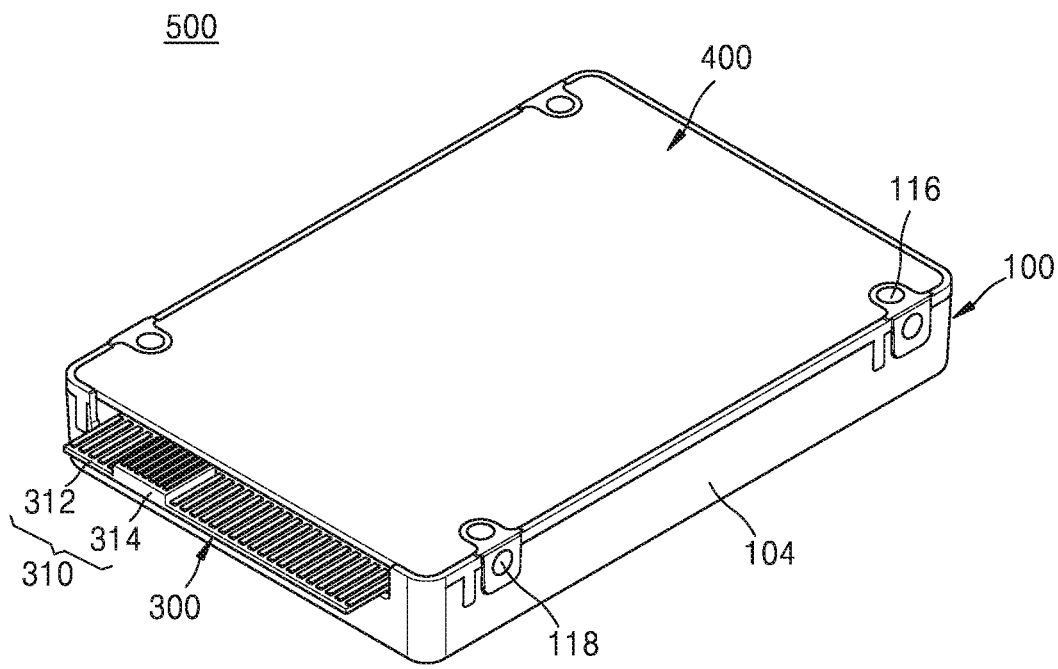
FIG. 1 is a perspective view of a solid state drive apparatus according to an example embodiment of the inventive concepts.

Example embodiments of the inventive concepts will be described in detail with reference to the accompanying drawings. The example embodiments of the inventive concepts may be implemented by a certain one or a combination of one or more of the example embodiments. Therefore, the spirit of the example embodiments of the inventive concepts are not interpreted only by one example embodiment. The accompanying drawings are not necessarily illustrated at a certain ratio. In some example embodiments, in order to clearly show characteristics of the example embodiments, a ratio of at least a part of structures illustrated in the drawing may be exaggerated.

In a solid state drive apparatus, a base substrate or a semiconductor chip that forms a package substrate module may be severely damaged by electrical stress of a high voltage, which is caused by external electrostatic discharge so that hard fails may be generated in hardware. In the solid state drive apparatus, as the quality of parts improves, hard fails caused by external electrostatic discharge are gradually reduced.

However, as a data processing speed of the solid state drive apparatus increases, in the solid state drive apparatus, due to electrical stress of a high voltage, which is caused by external electrostatic discharge, noise of a certain frequency band may be received from an electronic system to the inside of the solid state drive apparatus. When the noise is received, soft errors or soft fails in which software is damaged, for example, bit errors of one bit to several bits may be generated when the solid state drive apparatus processes data.

In one or more example embodiments of the inventive concepts, a solid state drive apparatus may be provided in order to reduce (or, alternatively, solve) soft errors (or soft fails) caused by electrostatic discharge.

FIG. 1 is a perspective view of a solid state drive apparatus according to an example embodiment of the inventive concepts.

Referring to FIG. 1, a solid state drive apparatus 500 includes a case 100, an electrostatic prevention structure (206 of FIG. 2), a package substrate module 300, and a cover 400. Screw holes 116 and 118 that may mechanically contact an external apparatus may be positioned in portions connected to respective ones of the pair of side walls 104 of the case 100.

The package substrate module 300 is mounted in the case 100 and an external connector 310 may be positioned outside the package substrate module 300. The external connector 310 may include a terminal 312 and a body 314. A shape of the external connector 310 may vary and the example embodiments of the inventive concepts are not limited thereto.

The external connector 310 connects the solid state drive apparatus 500 to an external host and may transmit and receive a signal and/or may receive power. The external connector 310 may include, for example, a connector configured to be connected to the external apparatus by a method in accordance with a parallel advanced technology attachment (PATA) standard, a serial advanced technology attachment (SATA) standard, a small computer system interface (SCSI) standard, or a program controlled interrupt (PCI) express (PCIe) standard.

Here, the SATA standard embraces all SATA-based standards such as SATA-2, SATA-3, external SATA (e-SATA) as well as SATA-1. The PCIe standard embraces all PCIe-based standards such as PCIe 2.0, PCIe 2.1, PCIe 3.0, and PCIe 4.0 as well as PCIe 1.0. The SCSI standard embraces all SCSI-based standards such as parallel SCSI, serial combination SA-SCSI (SAS), and iSCSI. In some embodiments, the external connector 310 may be a connector configured to support an M2 interface, an mSATA interface, or a 2.5" interface.

The solid state drive apparatus 500 may include the cover 400 that covers the case 100 and the package substrate module 300. Configurations of the case 100, the electrostatic prevention structure (206 of FIG. 2), and the package substrate module 300 will be described in more detail later.

Figure 2:
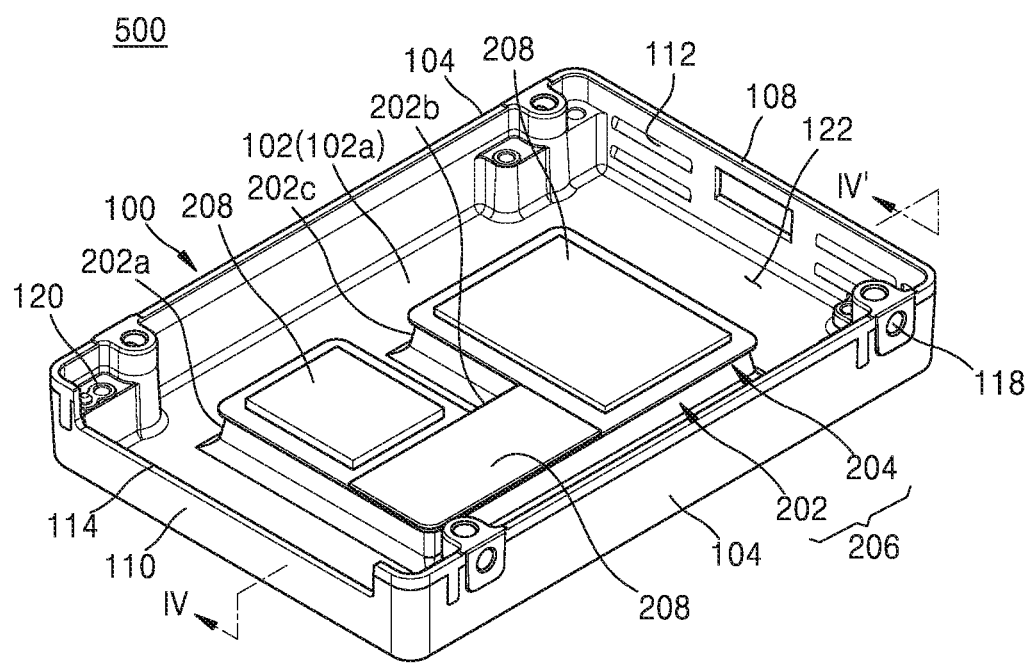
FIG. 2 is a perspective view of a solid state drive apparatus including a case and an electrostatic prevention structure according to an example embodiment of the inventive concepts.
Figure 3:
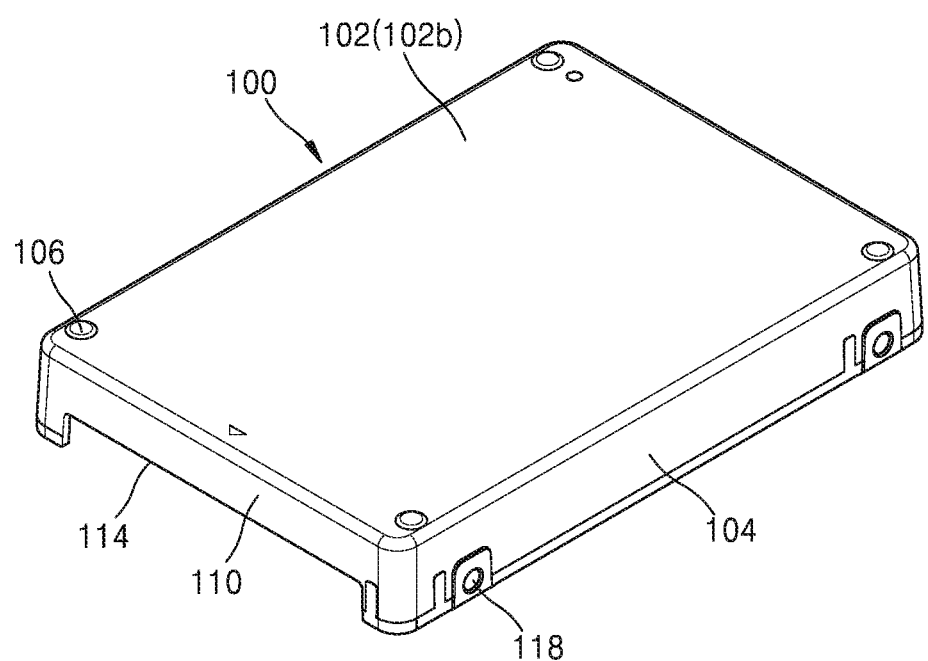
FIG. 3 is a perspective view of a rear surface of the case of FIG. 2.
Figure 4:
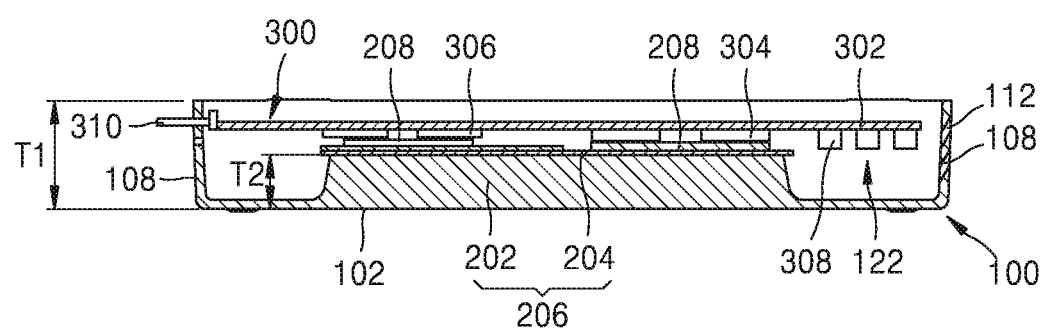
FIG. 4 is a cross-sectional view taken along the line IV-IV' of FIG. 2.

FIG. 2 is a perspective view of a solid state drive apparatus including a case and an electrostatic prevention structure according to an example embodiment of the inventive concepts. FIG. 3 is a perspective view of a rear surface of the case of FIG. 2. FIG. 4 is a cross-sectional view taken along the line IV-IV' of FIG. 2, additionally illustrating the package substrate module 300 of FIG. 1.

Referring to FIGS. 2-4, the solid state drive apparatus 500 may include a base 102 and the case 100 including side walls 104, 108, and 110 extending upward along a circumference of the base 102. The base 102 may include a surface 102a and a rear surface 102b. At an edge of the rear surface 102b of the base 102, a buffer 106 capable of reducing (or, alternatively, preventing) the case 100 from being damaged by external shock may be provided.

The side walls 104 may be left and right side walls. The side walls 108 and 110 may be front and rear side walls. Heat discharge holes 112 that receive air and may discharge heat generated by the package substrate module 300 may be provided in the front side walls 108. A recess 114 may be formed in the rear side wall 110 so that an external connector may be settled and opened.

As described above, the screw holes 116 and 118 that may mechanically contact the external apparatus may be positioned in portions connected to the side walls 104 of the case 100 and the side walls 104 of the case 100. The case 100 may be formed of a metal, for example, aluminum (Al). The case 100 may be manufactured by a casting method by using a metal, for example, Al.

The solid state drive apparatus 500 may include an electrostatic prevention structure 206 provided on at least a partial surface of the base 102. The electrostatic prevention structure 206 may be spaced apart from the side walls 104, 108, and 110. The electrostatic prevention structure 206 may be adjacent to a space 122 around the side walls 104, 108, and 110 of the case 100. The electrostatic prevention structure 206 may be spaced apart from the side walls 104, 108, and 110 by the space 122 around the side walls 104, 108, and 110 of the case 100.

The electrostatic prevention structure 206 may include a metal pillar 202 to protrude from at least a partial surface of the base 102 and an electrostatic absorbing member 204 on at least a partial surface of the metal pillar 202. The metal pillar 202 may be a square pillar member protruding from the base 102. The electrostatic absorbing member 204 may be formed of a magnetic material, for example, a ferrite material. The electrostatic absorbing member 204 may absorb static electricity that permeates from the outside of the case 100.

A metal plate may be used instead of the metal pillar 202. A cross-section of the metal pillar 202 may be square or polygonal. An upper surface of the metal pillar 202 may be a planar surface. However, example embodiments are not limited thereto and a case in which the upper surface of the metal pillar 202 is a non-planar surface may be included in the scope of the inventive concepts. In an example embodiment, the metal pillar 202 may be a heat dissipation member for dissipating heat generated by a package substrate module (300 of FIG. 4) to the outside.

In an example embodiment, the metal pillar 202 that forms the electrostatic prevention structure 206 may be integrated with the case 100. In an example embodiment, the metal pillar 202 that forms the electrostatic prevention structure 206 may be separate from the case 100. The metal pillar 202 may be formed of a metal, for example, Al, like the case 100. The metal pillar 202 may be manufactured by a casting method by using a metal, for example, Al.

A height T2 of the metal pillar 202 may be less than a height T1 of the case 100. A distance between the electrostatic absorbing member 204 mounted on the metal pillar 202 and first and second semiconductor chips 304 and 306 may be reduced by controlling the height T2 of the metal pillar 202. By doing so, it is possible to reduce (or, alternatively, prevent) soft errors of the first and second semiconductor chips 304 and 306 from being generated by external static electricity.

The metal pillar 202 may be divided into sub-pillars 202a, 202b, and 202c. The sub-pillars 202a, 202b, and 202c may be connected to each other. Therefore, the sub-pillar 202b may be referred to as a sub-connection pillar for connecting partial side walls of the sub-pillars 202a and 202c. The space 122 may be provided by the sub-connection pillar 202b between the sub-pillars 202a and 202c.

The sub-pillars 202a, 202b, and 202c may have various shapes or forms. When the sub-pillars 202a, 202b, and 202c may have various shapes or forms, a configuration of the electrostatic absorbing member 204 mounted on the sub-pillars 202a, 202b, and 202c varies, and thus, the soft errors of the first and second semiconductor chips 304 and 306 may be reduced (or, alternatively, prevented) from being generated by external static electricity.

In the solid state drive apparatus 500, heat transmitting members 208 are provided on the electrostatic absorbing member 204. The heat transmitting members 208 spaced apart from each other may be attached onto the electrostatic absorbing member 204. The heat transmitting members 208 spaced apart from each other and having small areas are attached onto the electrostatic absorbing member 204 having a large area so that a heat transmitting characteristic may improve. The heat transmitting member 208 may be formed of silicon resin or silicon rubber. The heat transmitting member 208 is provided as occasion demands or may be omitted.

In the solid state drive apparatus 500, the package substrate module 300 is mounted on the electrostatic prevention structure 206 and the heat transmitting member 208 in the case 100. The package substrate module 300 may be mounted on a substrate mounting unit 120 provided in the case 100. The package substrate module 300 may include a package base substrate 302 and the first and second semiconductor chips 304 and 306 on a lower surface of the package base substrate 302.

In FIG. 4, it is illustrated that the first and second semiconductor chips 304 and 306 are mounted on the lower surface of the package base substrate 302. However, another semiconductor chip may be mounted on an upper surface of the package base substrate 302. The first and second semiconductor chips 304 and 306 may be memory devices or non-memory devices. An active or passive device 308 may be mounted on the lower surface of the package base substrate 302. An external connector 310 that may be electrically connected to an external host (device) may be provided at a side surface of the package base substrate 302.

The metal pillar 202 of the solid state drive apparatus 500 protrudes from a partial surface of the base 102, is spaced apart from the side walls 104, and is adjacent to the space 122. Therefore, the solid state drive apparatus 500 may increase a radiation distance and a conduction distance of static electricity (or an electro-magnetic wave) that permeates from the outside. The solid state drive apparatus 500 may reduce (or, alternatively, prevent) the first and second semiconductor chips 304 and 306 mounted in the package substrate module 300 from being radiation damaged and conduction damaged by static electricity (or an electro-magnetic wave) permeating from the outside.

The solid state drive apparatus 500 may reduce (or, alternatively, prevent) the first and second semiconductor chips 304 and 306 mounted in the package substrate module 300 from being radiation damaged and conduction damaged by static electricity permeating from the outside due to the space 122 between the sub-pillars 202a and 202c, which is provided by the sub-pillar 202b.

Furthermore, the solid state drive apparatus 500 includes the electrostatic absorbing member 204 so that static electricity (or an electro-magnetic wave) permeating from the outside of the case 100 may be absorbed. The solid state drive apparatus 500 may reduce (or, alternatively, prevent) the first and second semiconductor chips 304 and 306 mounted in the package substrate module 300 from being radiation damaged and conduction damaged by static electricity permeating from the outside.

Hereinafter, drawings for describing components of the solid state drive apparatus 500 in more detail are provided.

Figure 5:
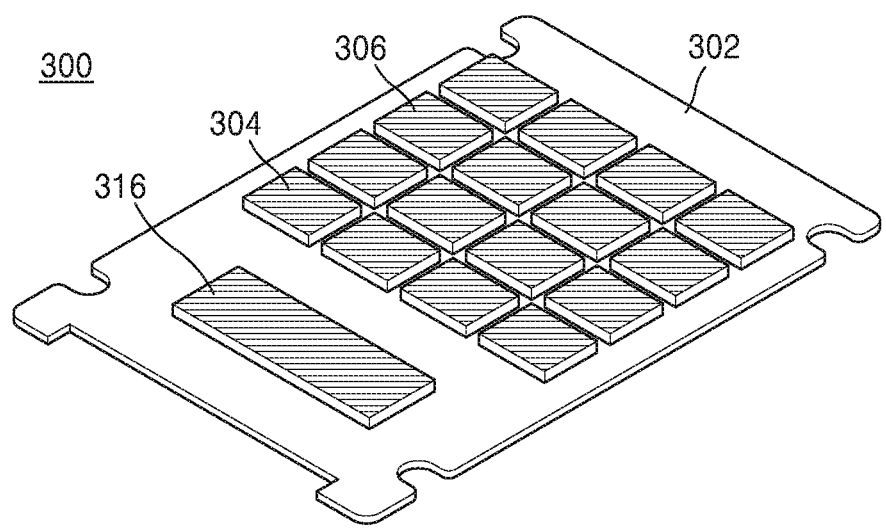
FIG. 5 is a perspective view illustrating a package substrate module of a solid state drive apparatus according to an example embodiment of the inventive concepts.

FIG. 5 is a perspective view illustrating a package substrate module of a solid state drive apparatus according to an example embodiment of the inventive concepts.

Referring to FIG. 5, the package substrate module 300 of FIG. 5 may be applied to the solid state drive apparatus (500 of FIG. 1). The package substrate module 300 may include the package base substrate 302, the first and second semiconductor chips 304 and 306, and a controller chip 316 that are attached to one side of the package base substrate 302.

The package base substrate 302 may be a printed circuit board (PCB). For example, the package base substrate 302 may be a one-sided PCB or a double-sided PCB. The package base substrate 302 may be a multi-layer PCB.

The package base substrate 302 may include a substrate base formed of at least one material selected from phenol resin, epoxy resin, and polyimide. The substrate base may be formed of at least one material selected from phenol resin, epoxy resin, and polyimide. The substrate base may include at least one material selected from, for example, frame retardant 4 (FR4), tetrafunctional epoxy, polyphenylene ether, epoxy/polyphenylene oxide, bismaleimide triazine (BT), thermount, cyanate ester, polyimide, and liquid crystal (LC) polymer.

The package base substrate 302 may have wiring patterns on an upper surface and a lower surface of the substrate base. In some example embodiments, when the substrate base is formed of a plurality of layers, the wiring patterns may be formed between the plurality of layers formed by the substrate base. In the substrate base of the package base substrate 302, a conductive via for connecting the wiring patterns may be formed. The conductive via passes through all or a part of the substrate base and may electrically connect the wiring patterns. The wiring patterns and/or the conductive via may be formed of copper (Cu), nickel (Ni), stainless steel, or beryllium CU.

Solder resist layers that cover at least parts of the wiring patterns arranged on the upper surface and the lower surface of the substrate base may be formed on an upper surface and a lower surface of the package base substrate 302. Among the wiring patterns arranged on the upper surface and the lower surface of the substrate base, parts that are not covered with the solder resist layers may be used as pads electrically connected to the first semiconductor chips 304, the second semiconductor chips 306, the controller chip 316, an active element or a passive element.

Each of the first and second semiconductor chips 304 and 306, and the controller chip 316 may include a semiconductor substrate. The semiconductor substrate may include, for example, silicon (Si). Alternatively, the semiconductor substrate may include a semiconductor element such as germanium (Ge) or a compound semiconductor such as silicon carbide (SiC), gallium arsenide (GaAs), indium arsenide (InAs), and indium phosphide (InP). The semiconductor substrate may have an active surface and an inactive surface opposite to the active surface. In each of the first semiconductor chips 304, the second semiconductor chips 306, and the controller chip 316, a semiconductor device including a plurality of various kinds of individual devices may be formed on the active surface of the semiconductor substrate.

Each of the first semiconductor chips 304 may be a non-volatile memory device. The non-volatile memory device may be, for example, flash memory, phase-change random access memory (RAM) (PRAM), resistive RAM (RRAM), ferroelectric RAM (FeRAM), or solid magnetic RAM (MRAM). However, example embodiments of the inventive concepts are not limited thereto. The flash memory may be, for example, NAND flash memory. The flash memory may be, for example, V-NAND flash memory. The non-volatile memory device may be formed of one semiconductor die or may be formed of several stacked semiconductor dies.

Each of the second semiconductor chips 306 may be a volatile memory device. The volatile memory device may be, for example, dynamic RAM (DRAM), static RAM (SRAM), synchronous dynamic RAM (SDRAM), double data rate (DDR) RAM, or rambus dynamic (RD)RAM. However, example embodiments of the inventive concepts are not limited thereto. The volatile memory device provides a cache function of storing data frequently used when an external host accesses the solid state drive apparatus (500 of FIG. 1) and may scale access-time and data-transfer performance so as to fit process performance of the external host connected to the solid state drive apparatus 500.

The controller chip 316 may control the first semiconductor chips 304 and the second semiconductor chips 306. A controller may be mounted in the controller chip 316. The controller may control access to data stored in the non-volatile memory device. That is, the controller may control a write/read operation of the non-volatile memory device, for example, the flash memory in accordance with a control command of the external host. The controller may be formed of an additional control semiconductor chip such as an application specific integrated circuit (ASIC). The controller may be designed to be automatically executed by an operation system of the external host, for example, when the solid state drive apparatus 500 is connected to the external host.

The controller may provide a standard protocol such as parallel advanced technology attachment (PATA), serial advanced technology attachment (SATA), SCSI, or PCI express (PCIe). In addition, the controller may perform wear levelling, garbage collection, bad block management, and error correcting code (ECC) on the non-volatile memory device. In this case, the controller may include a script for automatic execution and an application program that may be executed by the external host.

The package substrate module 300 may further include an active or passive device (308 of FIG. 4) such as a chip resistor, a chip capacitor, an inductor, a switch, a temperature sensor, a direct current (DC)-DC converter, quartz for generating a clock signal, or a voltage regulator, which is attached onto the package base substrate 302.

Figure 6:
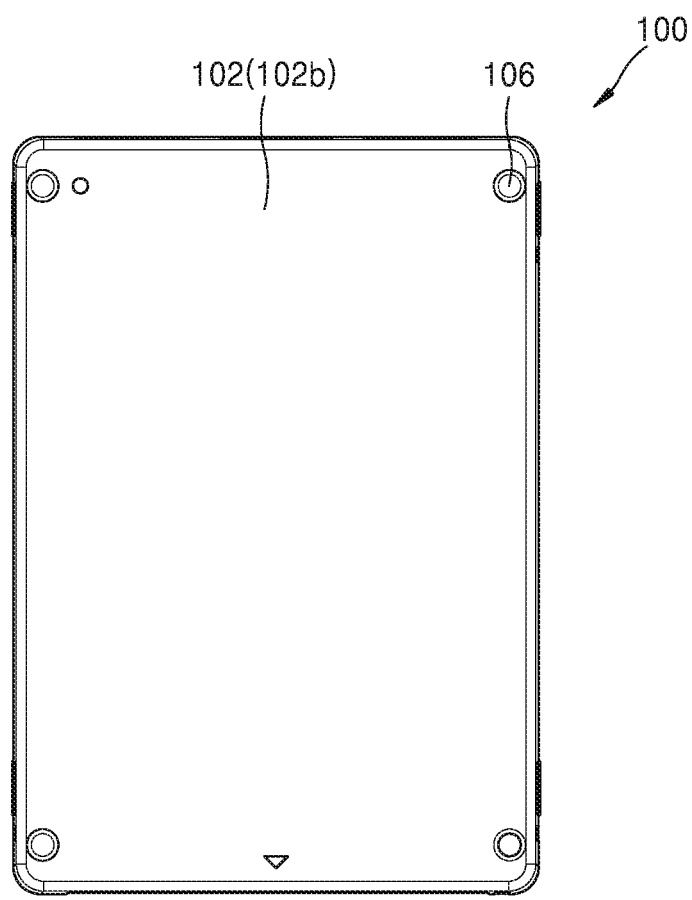
FIGS. 6 and 7 are a rear view and a side view of a case of a solid state drive apparatus according to an example embodiment of the inventive concepts.
Figure 7:
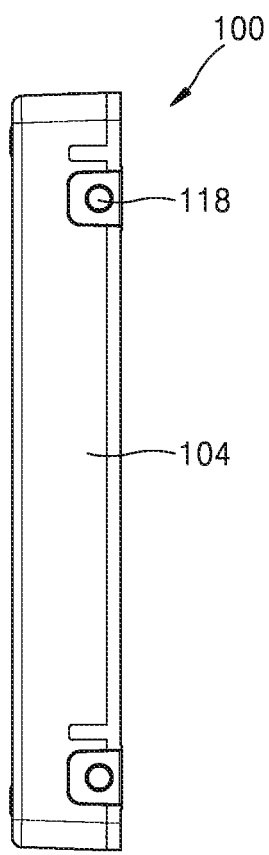

FIGS. 6 and 7 are a rear view and a side view of a case of a solid state drive apparatus according to an example embodiment of the inventive concepts.

Referring to FIGS. 6 and 7, as described above, the case (100 of FIGS. 1 to 4) of the solid state drive apparatus (500 of FIG. 1) may be provided. The case 100 may include the base 102 and the side walls 104. As described above, at the edge of the rear surface 102b of the base 102, the buffer 106 capable of reducing (or, alternatively, preventing) the case 100 from being damaged by external shock may be provided. Furthermore, the screw holes 118 that may mechanically contact the external apparatus may be positioned in the side walls 104 of the case 100.

Figure 8:
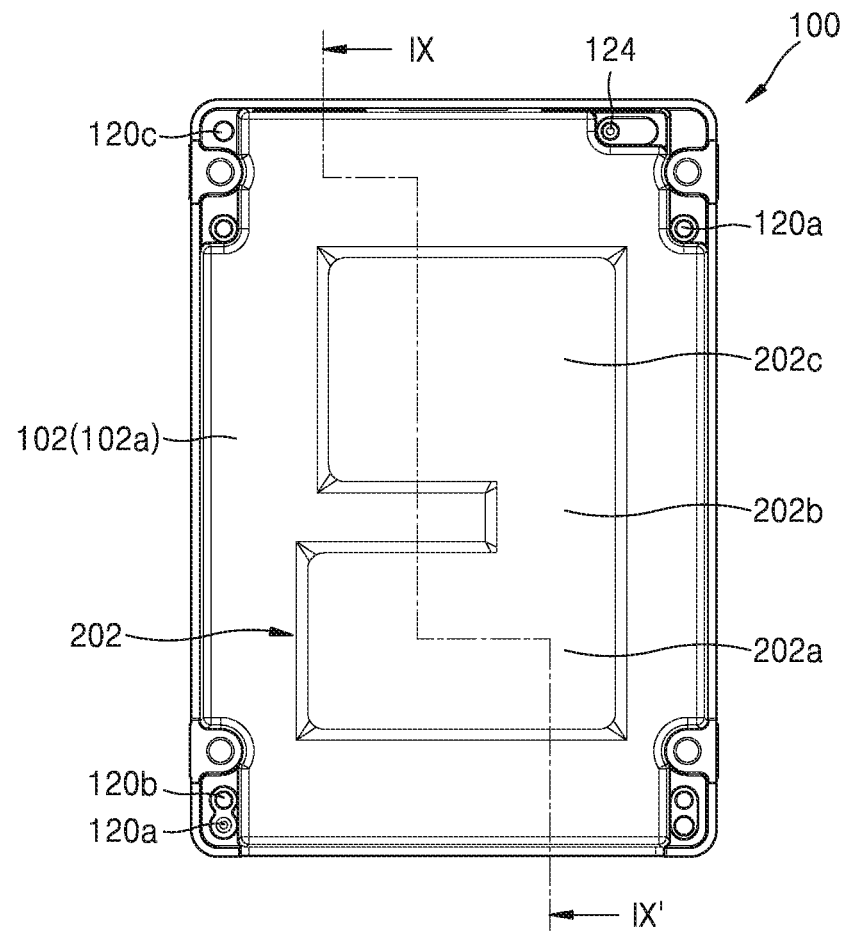
FIG. 8 is a plan view of a case of a solid state drive apparatus according to an example embodiment of the inventive concepts.

FIG. 8 is a plan view of a case of a solid state drive apparatus according to an example embodiment of the inventive concepts.

In detail, as described above, the case (100 of FIGS. 1 to 4) of the solid state drive apparatus (500 of FIG. 1) may include the base 102. The base 102 may include the surface 102a. The metal pillar 202 that forms the electrostatic prevention structure 206 may be provided on the surface 102a of the base 102.

The metal pillar 202 may be divided into the sub-pillars 202a, 202b, and 202c. The sub-pillars 202a, 202b, and 202c may be connected to each other. Therefore, the sub-pillar 202b may be referred to as a sub-connection pillar for connecting partial side walls of the sub-pillars 202a and 202c.

At an edge of the case 100, the substrate mounting unit 120, on which the package substrate module (300 of FIG. 4) may be mounted, may be provided. The package base substrate (302 of FIG. 4) of the package substrate module (300 of FIG. 4) may be mounted on the substrate mounting unit 120.

Screw holes 120a, 120b, and 120c that may be fastened to the package base substrate (302 of FIG. 4) may be provided in the substrate mounting unit 120. The screw holes 120a, 120b, and 120c may be provided at the edge of the case 100.

In addition, in the case 100, a buffer pin 124 protruding from the surface 102a of the base 102 may be provided so that the package base substrate 302 may be easily settled in the substrate mounting unit 120. Furthermore, the screw holes 116 that extend to the inside of the case 100 and may mechanically contact the external apparatus may be positioned.

Figure 9:
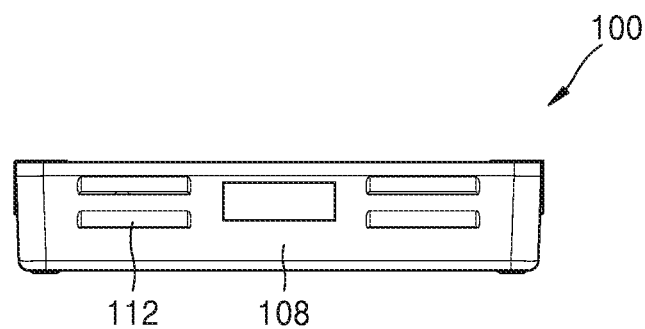
FIGS. 9 and 10 are side views of a case of a solid state drive apparatus according to an example embodiment of the inventive concepts.
Figure 10:
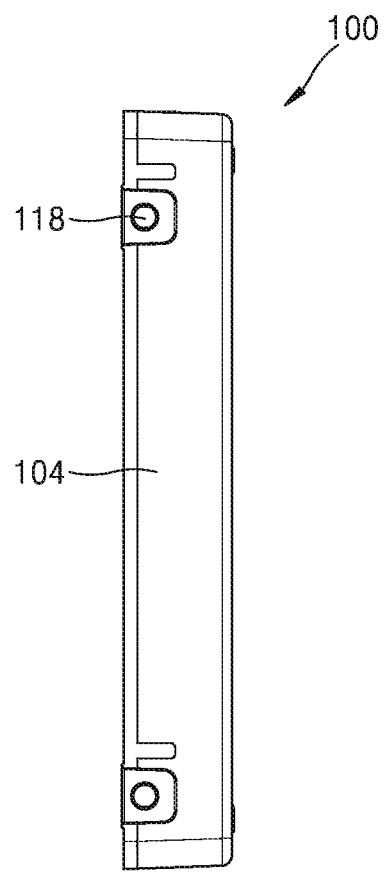

FIGS. 9 and 10 are side views of a case of a solid state drive apparatus according to an embodiment of the inventive concepts.

Referring to FIGS. 9 and 10, the case (100 of FIGS. 1 to 4) of the solid state drive apparatus (500 of FIG. 1) may include the side walls 104 and 108. The side walls 104 may be the left and right side walls of the case 100 of FIG. 4. The side walls 108 may be the front and rear side walls of the case 100 of FIG. 4.

The heat discharge holes 112 for receiving air and discharging heat generated by the package substrate module (300 of FIG. 4) may be provided in the front and rear side walls 108. Furthermore, the screw holes 116 that may mechanically contact the external apparatus may be positioned in the side walls 104 of the case 100.

Figure 11:
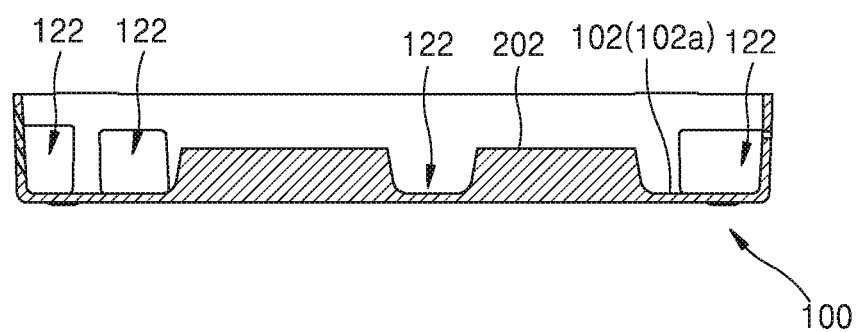
FIG. 11 is a cross-sectional view taken along the line XI-XI' of FIG. 8.

FIG. 11 is a cross-sectional view taken along the line XI-XI' of FIG. 8.

In detail, the case (100 of FIGS. 1 to 4) of the solid state drive apparatus (500 of FIG. 1) may include the base 102. The base 102 may include the surface 102*a*. The metal pillar 202 that forms the electrostatic prevention structure 206 may be provided on the surface 102*a* of the base 102.

Furthermore, the metal pillar 202 is formed to protrude from the surface 102*a* of the base 102 and to be adjacent to the space 122. That is, the metal pillar 202 is divided by the space 122 on the surface 102*a* of the base 102. The radiation distance and the conduction distance of static electricity that permeates from the outside may be increased by the space 122.

Figure 12:
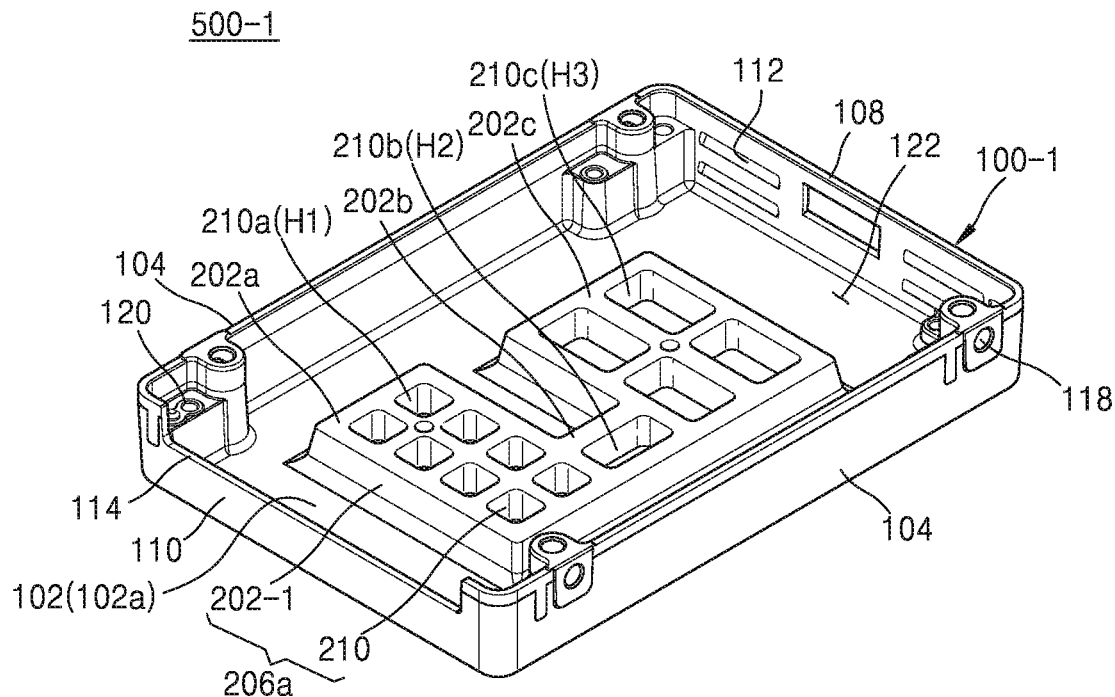
FIG. 12 is a perspective view of a solid state drive apparatus including a case and an electrostatic prevention structure according to an example embodiment of the inventive concepts.

FIG. 12 is a perspective view of a solid state drive apparatus including a case and an electrostatic prevention structure according to an example embodiment of the inventive concepts.

Referring to FIG. 12, a solid state drive apparatus 500-1 may be the same as the solid state drive apparatus 500 of FIGS. 1 to 4 excluding a case 100-1 including an electrostatic prevention structure 206*a*.

In FIG. 12, descriptions that are the same as those of FIGS. 1 to 4 will not be given or will be simply given. In FIG. 12, the electrostatic prevention structure 206*a* further includes the electrostatic absorbing member (204 of FIGS. 2 and 4), which will be omitted for convenience sake.

The case 100-1 may include the electrostatic prevention structure 206*a*. The case 100-1 and the electrostatic prevention structure 206*a* may be integrated with each other. The electrostatic prevention structure 206*a* may include a metal pillar 202-1. The metal pillar 202-1 may be divided into the sub-pillars 202*a*, 202*b*, and 202*c*.

The sub-pillars 202*a*, 202*b*, and 202*c* may be connected to each other. The electrostatic prevention structure 206*a* may include holes 210*a*, 210*b*, and 210*c* respectively in the metal pillar 202-1, that is, the sub-pillars 202*a*, 202*b*, and 202*c*.

In an example embodiment, the holes 210*a*, 210*b*, and 210*c* in the sub-pillars 202*a*, 202*b*, and 202*c* may expose the base 102. In an example embodiment, the holes 210*a*, 210*b*, and 210*c* in the sub-pillars 202*a*, 202*b*, and 202*c* may not expose the base 102. The holes 210*a*, 210*b*, and 210*c* may respectively include individual holes H1, H2, and H3.

The individual holes H1, H2, and H3 may be partitioned off by a partition member IP. Sizes of the individual holes H1, H2, and H3 in the holes 210*a*, 210*b*, and 210*c* may vary. The electrostatic absorbing member (204 of FIGS. 2 and 4) is mounted on the metal pillar 201-1 and the holes 210*a*, 210*b*, and 210*c* so that the electrostatic prevention structure 206*a* may be completed.

Since the holes 210*a*, 210*b*, and 210*c* respectively including the individual holes H1, H2, and H3 are provided in the metal pillar 202-1 of the solid state drive apparatus 500-1, the radiation distance and the conduction distance of static electricity permeating from the outside may increase. The solid state drive apparatus 500-1 may reduce (or, alternatively, prevent) the first and second semiconductor chips 304 and 306 mounted on the package substrate module (300 of FIG. 4) from being radiation damaged and conduction damaged by external static electricity.

Figure 13:
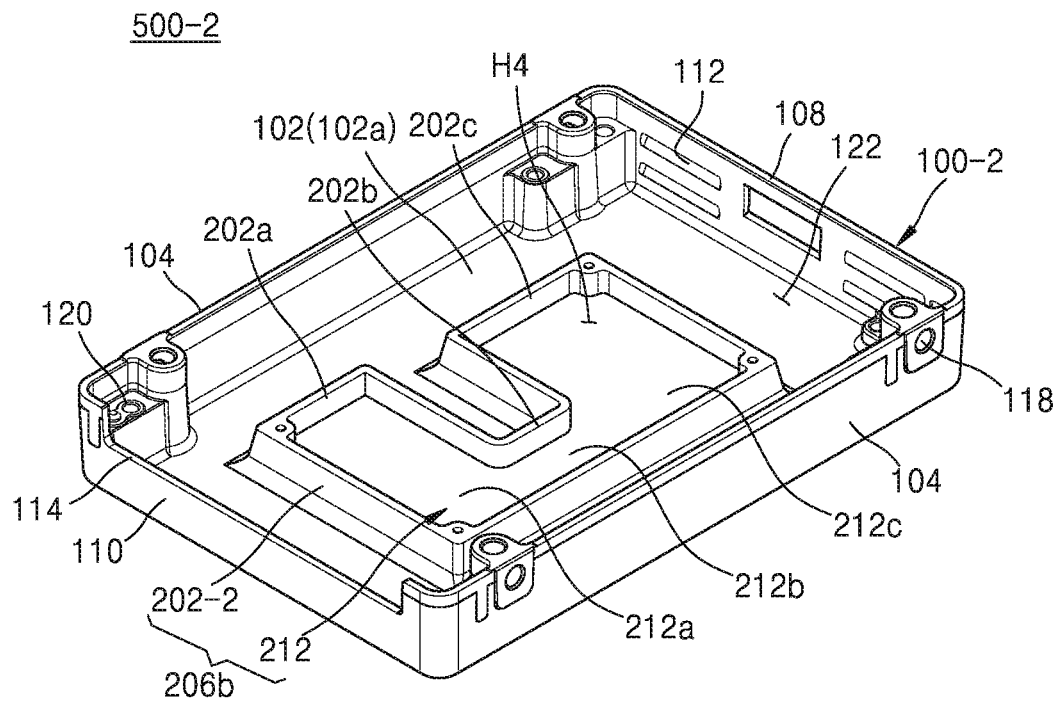
FIG. 13 is a perspective view of a solid state drive apparatus including a case and an electrostatic prevention structure according to an example embodiment of the inventive concepts.

FIG. 13 is a perspective view of a solid state drive apparatus including a case and an electrostatic prevention structure according to an example embodiment of the inventive concepts.

Referring to FIG. 13, a solid state drive apparatus 500-2 may be the same as the solid state drive apparatus 500 of FIGS. 1 to 4 and the solid state drive apparatus 500-1 of FIG. 12 excluding a case 100-2 including an electrostatic prevention structure 206*b*.

In FIG. 13, descriptions that are the same as those of FIGS. 1 to 4 and 12 will not be given or will be simply given. In FIG. 13, the electrostatic prevention structure 206*b* further includes the electrostatic absorbing member (204 of FIGS. 2 and 4), which will be omitted for convenience sake.

The case 100-2 may include the electrostatic prevention structure 206*b*. The case 100-2 and the electrostatic prevention structure 206*b* may be integrated with each other. The electrostatic prevention structure 206*b* may include a metal pillar 202-2. The metal pillar 202-2 may be divided into the sub-pillars 202*a*, 202*b*, and 202*c*.

The sub-pillars 202*a*, 202*b*, and 202*c* may be connected to each other. The electrostatic prevention structure 206*b* may include holes 212*a*, 212*b*, and 212*c* in the metal pillar 202-2, that is, the sub-pillars 202*a*, 202*b*, and 202*c*.

In an example embodiment, the holes 212*a*, 212*b*, and 212*c* in the sub-pillars 202*a*, 202*b*, and 202*c* may expose the base 102. In an example embodiment, the holes 212*a*, 212*b*, and 212*c* in the sub-pillars 202*a*, 202*b*, and 202*c* may not expose the base 102. The holes 212*a*, 212*b*, and 212*c* may include a communication hole H4. The electrostatic absorbing member (204 of FIGS. 2 and 4) is mounted on the metal pillar 201-1 and the holes 212*a*, 212*b*, and 212*c* so that the electrostatic prevention structure 206*a* may be completed.

Since the holes 212*a*, 212*b*, and 212*c* including the communication hole H4 are provided in the metal pillar 202-2 of the solid state drive apparatus 500-2, the radiation distance and the conduction distance of static electricity permeating from the outside may increase. The solid state drive apparatus 500-2 may reduce (or, alternatively, prevent) the first and second semiconductor chips 304 and 306 mounted on the package substrate module (300 of FIG. 4) from being radiation damaged and conduction damaged by external static electricity.

Figure 14:
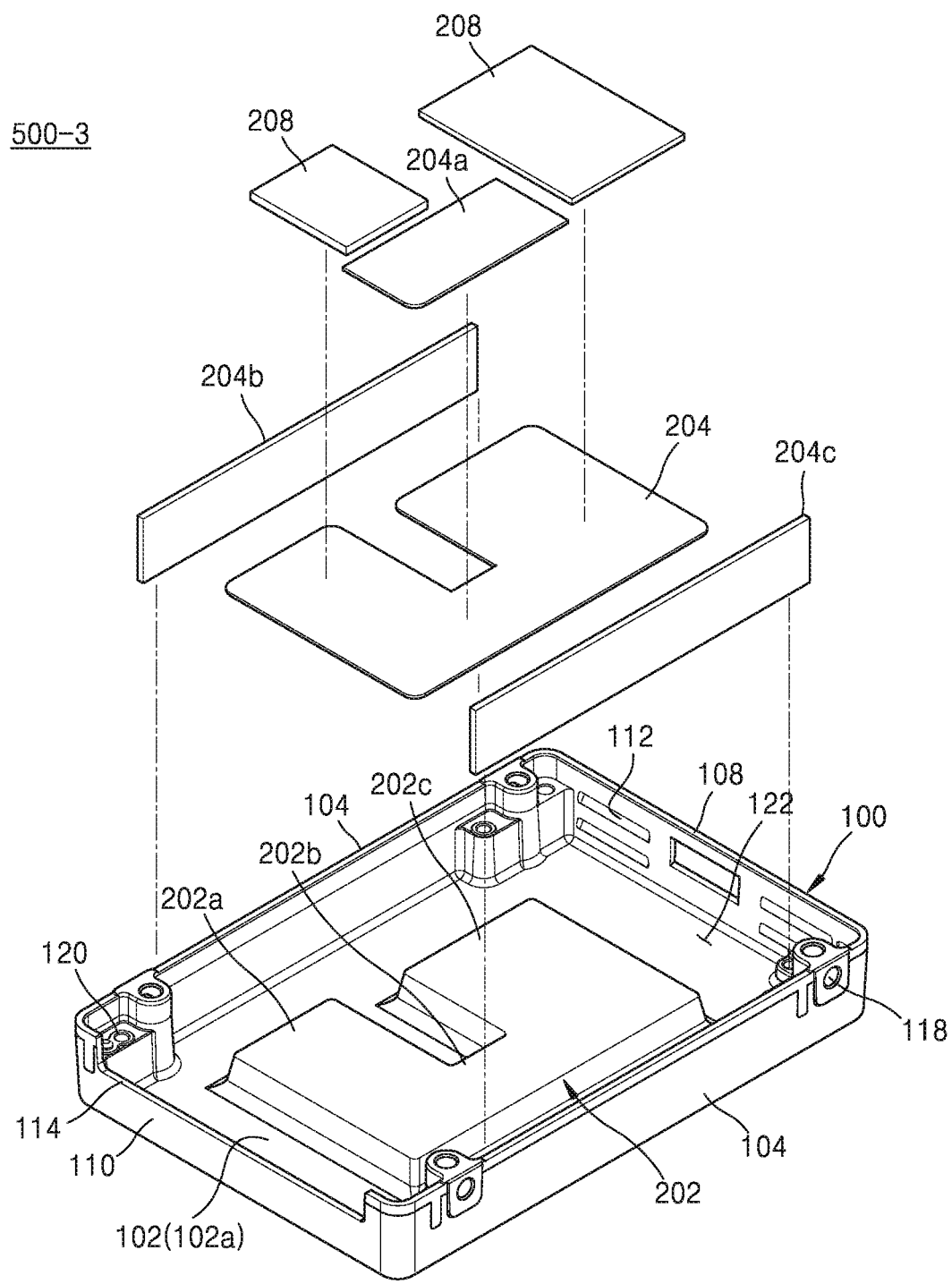
FIG. 14 is an exploded perspective view of a solid state drive apparatus including a case and an electrostatic prevention structure according to an example embodiment of the inventive concepts.

FIG. 14 is an exploded perspective view of a solid state drive apparatus including a case and an electrostatic prevention structure according to an example embodiment of the inventive concepts.

Referring to FIG. 14, a solid state drive apparatus 500-3 may be the same as the solid state drive apparatus 500 of FIGS. 1 to 4 excluding an electrostatic prevention structure 206*c* including electrostatic absorbing members 204, 204*a*, and 204*c*.

In FIG. 14, descriptions that are the same as those of FIGS. 1 to 4 will not be given or will be simply given. The solid state drive apparatus 500-3 may be the same as the solid state drive apparatus 500 of FIGS. 1 to 4 excluding that electrostatic absorbing members 204*a* 204*b*, and 204*c* are further included as the electrostatic prevention structure (206 of FIGS. 2 and 4). The electrostatic prevention structure 206 may include the metal pillar 202 and the electrostatic absorbing members 204, 204*a*, 204*b*, and 204*c*.

The electrostatic absorbing members 204, 204*a*, 204*b*, and 204*c* may include the first electrostatic absorbing member 204 on the metal pillar 202, the second electrostatic absorbing member 204a on a partial surface of the metal pillar 202, the third electrostatic absorbing members 204b and 204c at a circumference of the metal pillar 202, for example, in the case 100 of the metal pillar 202.

The electrostatic absorbing members 204a, 204b, and 204c are further provided on a surface of the metal pillar 202 of the solid state drive apparatus 500-3 or at the circumference of the metal pillar 202 so that static electricity permeating from the outside may be absorbed better. Therefore, the solid state drive apparatus 500-3 may reduce (or, alternatively, prevent) the first and second semiconductor chips 304 and 306 mounted on the package substrate module (300 of FIG. 4) from being radiation damaged and conduction damaged by external static electricity.

Figure 15:
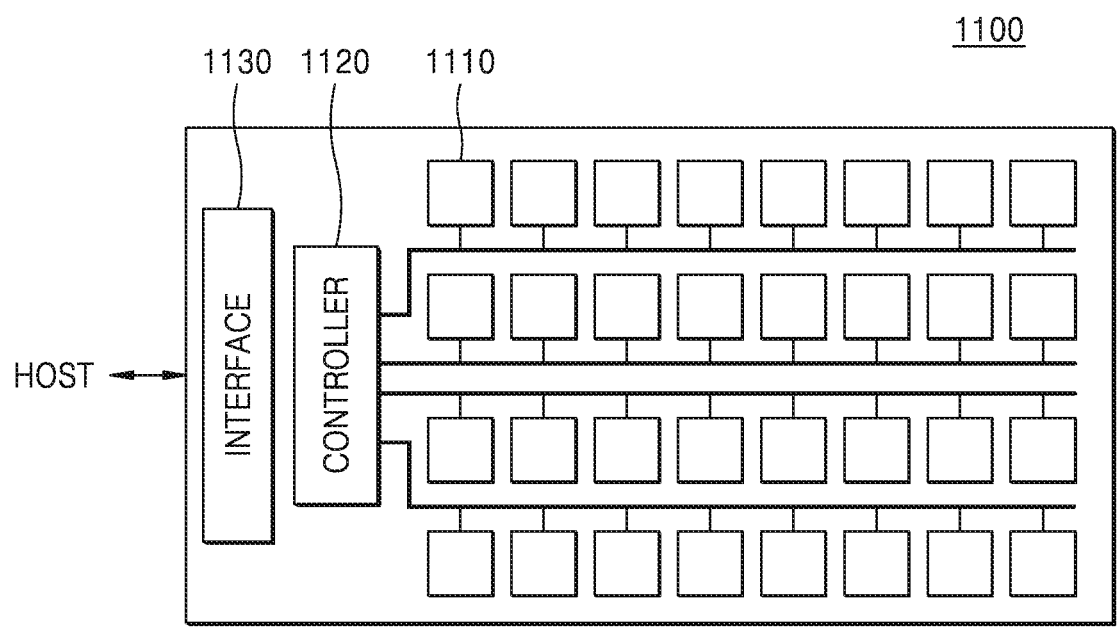
FIG. 15 is a block diagram of a solid state drive apparatus according to an example embodiment of the inventive concepts.

FIG. 15 is a block diagram of a solid state drive apparatus according to an example embodiment of the inventive concepts.

Referring to FIG. 15, a solid state drive apparatus 1100 includes non-volatile memories 1110 and a controller 1120. The non-volatile memories 1110 may store data and may have a non-volatile characteristic of maintaining the stored data as it is although power supply is stopped. The solid state drive apparatus 1100 may be one of the solid state drive apparatuses 500, 500-1, and 500-3.

The controller 1120 reads the data stored in the non-volatile memory 1110 in response to read/write request of a host HOST or may store the data of the non-volatile memory 1110. An interface 1130 transmits command and address signals to the host HOST or receives the command and address signals from the host HOST and transmits the command and address signals to the non-volatile memory 1110 through the controller 1120 or may receive the command and address signals from the non-volatile memory 1110.

The solid state drive apparatus 1100 may further include an active element or a passive element such as a resistor, a capacitor, an inductor, a switch, a temperature sensor, a DC-DC converter, quartz for generating a clock, or a voltage regulator.

Figure 16:
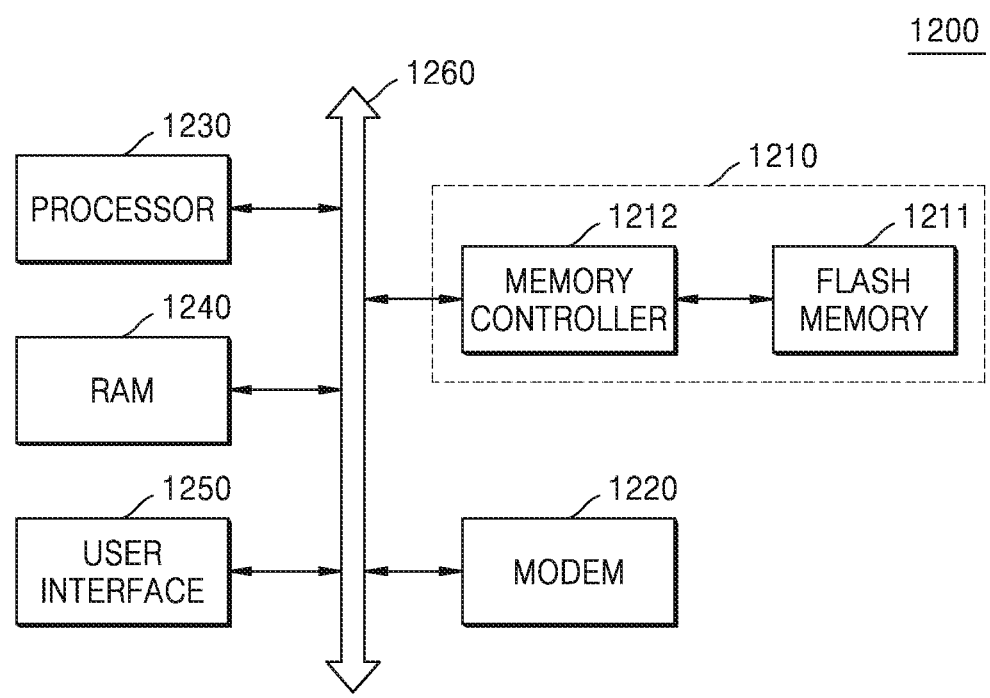
FIG. 16 is a block diagram of a system according to an example embodiment of the inventive concepts.

FIG. 16 is a block diagram of a system according to an example embodiment of the inventive concepts.

Referring to FIG. 16, a system 1200 may include a processor 1230 such as a central processing unit (CPU) communicating through a common bus 1260, random access memory (RAM) 1240, a user interface 1250, and a modem 1220. Further, the system 1200 may include a storage apparatus 1210. The devices may transmit a signal to the storage apparatus 1210 and receive a signal from the storage apparatus 1210 through the common bus 1260. The storage apparatus 1210 may include a flash memory 1211 and a memory controller 1212. The flash memory 1210 may store data and may have a non-volatile characteristic capable of maintaining the stored data as it is although power supply is stopped. The storage apparatus 1210 may be one of the above-described solid state drive apparatuses 500, 500-1, and 500-3.

While example embodiments of the inventive concepts have been particularly shown and described with reference to some example embodiments thereof, it will be understood that various changes in form and details may be made therein without departing from the spirit and scope of the following claims.

What is claimed is:

1. A solid state drive apparatus comprising: a case including a base and side walls, the side walls extending perpendicular to the base along a circumference of the base, the sidewalls having a plurality of substrate mounting units therein;
   an electrostatic prevention structure protruding from at least a partial surface of the base, the electrostatic prevention structure including a metal pillar and an electrostatic absorbing member, the metal pillar being spaced apart from the side walls of the case such that the metal pillar is closer to a center of the case than the plurality of substrate mounting units, and the electrostatic absorbing member being irremovably fixed to at least a partial surface of the metal pillar;
   a package substrate module on the electrostatic prevention structure in the case the package substrate module including a package base substrate and a semiconductor chip, the package base substrate being mounted to the case via the plurality of substrate mounting units and the semiconductor chip being on a surface of the package base substrate facing an interior of the case; and
   a cover covering the case and the package substrate module, wherein
   a height of the metal pillar is less than that of the side walls of the case such that the package substrate module mounted to the case via the plurality of substrate mounting units is above the electrostatic absorbing member with the semiconductor chip electrically isolated from the electrostatic absorbing member irremovably fixed to the partial surface of the metal pillar.

2. The solid state drive apparatus of claim 1, wherein the metal pillar is integrated with the case such that the metal pillar is integrated with the base and the side walls of the case.

3. The solid state drive apparatus of claim 1, wherein
   a height of the metal pillar is less than that of the side walls of the case, and
   the electrostatic absorbing member includes a ferrite magnet on an upper surface of the metal pillar, the electrostatic absorbing member configured to absorb static electricity permeating from an outside of the case.

4. The solid state drive apparatus of claim 1, further comprising:
   a heat transmitting material member on the electrostatic absorbing member.

5. The solid state drive apparatus of claim 1, wherein the metal pillar has a shape forming a plurality of individual holes exposing the base, the plurality of individual holes being spaced apart and having different sizes.

6. The solid state drive apparatus of claim 1, wherein the metal pillar has shape that forms a communication hole exposing the base.

7. The solid state drive apparatus of claim 1, further comprising:
   an additional electrostatic absorbing member spaced on a circumference of the metal pillar or on the electrostatic absorbing member such that the additional electrostatic absorbing member is separated from the side walls by a distance.

8. The solid state drive apparatus of claim 1, wherein the metal pillar comprises:
   a heat dissipation device configured to dissipate heat generated by the package substrate module to outside the solid state drive apparatus.

9. The solid state drive apparatus of claim 1, wherein a cross-section of the metal pillar is square or polygonal.

* * * * *